(12) United States Patent
Warabino

(10) Patent No.: US 8,587,064 B2
(45) Date of Patent: Nov. 19, 2013

(54) SEMICONDUCTOR DEVICE

(75) Inventor: Tomoyuki Warabino, Olta-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 90 days.

(21) Appl. No.: 13/235,304

(22) Filed: Sep. 16, 2011

(65) Prior Publication Data

US 2012/0223406 A1    Sep. 6, 2012

(30) Foreign Application Priority Data

Mar. 2, 2011    (JP) .................. 2011-044672

(51) Int. Cl.
*H01L 27/01* (2006.01)
*H01L 27/12* (2006.01)
*H01L 31/0392* (2006.01)

(52) U.S. Cl.
USPC  257/347; 257/288; 257/E21.17; 257/E21.077; 257/E21.32; 257/E21.267; 257/E21.278; 257/E21.293; 257/E21.499

(58) Field of Classification Search
USPC .................. 257/347, 288, 649, 760, E21.077, 257/E21.17, E21.32, E21.267, E21.278, 257/E21.293, E21.499
See application file for complete search history.

(56) References Cited

U.S. PATENT DOCUMENTS

| | | | |
|---|---|---|---|
| 5,736,430 A * | 4/1998 | Seefeldt et al. | 438/53 |
| 7,202,137 B2 * | 4/2007 | Delpech et al. | 438/386 |
| 7,235,456 B2 * | 6/2007 | Sato et al. | 438/411 |
| 7,253,479 B2 | 8/2007 | Sugaya | |
| 7,846,811 B2 | 12/2010 | Villa et al. | |
| 2004/0232554 A1 | 11/2004 | Hirano et al. | |
| 2007/0007595 A1 | 1/2007 | Hirano et al. | |
| 2007/0246754 A1 | 10/2007 | Sonsky et al. | |

FOREIGN PATENT DOCUMENTS

| | | |
|---|---|---|
| JP | 2002-334967 | 11/2002 |
| JP | 2003-298047 | 10/2003 |
| JP | 2006-237455 | 9/2006 |
| JP | 2007-165693 A | 6/2007 |
| JP | 2007-180569 | 7/2007 |
| JP | 2007-266613 | 10/2007 |

OTHER PUBLICATIONS

Japanese Office Action dated Jul. 17, 2013 in counterpart Japanese Patent Application No. 2011-044672 with English Translation.

* cited by examiner

*Primary Examiner* — David Nhu
(74) *Attorney, Agent, or Firm* — Patterson & Sheridan, LLP

(57) ABSTRACT

According to one embodiment, a semiconductor device includes a semiconductor substrate, an insulating film, a heat conductive member, and an element. A cavity and a connecting hole are formed in the semiconductor substrate. The connecting hole spatially connects the cavity to an upper face of the semiconductor substrate. The insulating film is provided on inner faces of the cavity and the connecting hole. The heat conductive member is embedded in the cavity and the connecting hole. Heat conductivity of the heat conductive member is higher than heat conductivity of the insulating film. And, the element is formed in a region immediately above the cavity in the semiconductor substrate.

10 Claims, 8 Drawing Sheets

SEMICONDUCTOR DEVICE

CROSS-REFERENCE TO RELATED APPLICATIONS

This application is based upon and claims the benefit of priority from the prior Japanese Patent Application No. 2011-044672, filed on Mar. 2, 2011; the entire contents of which are incorporated herein by reference.

FIELD

Embodiments described herein relate generally to a semiconductor device.

BACKGROUND

In a semiconductor device in which an analog circuit and a digital circuit are mounted in a mixed manner, there is a problem in which a clock signal used in the digital circuit reaches the analog circuit through a substrate, becomes noise and gives a bad effect to an operation of the analog circuit. As a method for suppressing such cross talk through the substrate, a method is known that a contact is connected to a region between the circuits in the semiconductor substrate and the semiconductor substrate is grounded through this contact so as to stabilize the potential. However, with this method, since the semiconductor substrate is still present between the circuits, cross talk through the substrate cannot be effectively suppressed.

Also, a technique in which an SOI (silicon on insulator) substrate is used as a semiconductor substrate has been proposed. The SOI substrate has an embedded insulating film made of a silicon oxide provided on a base material, and a thin silicon layer is provided on this embedded insulating film. By forming an element in the silicon layer of the SOI substrate and by surrounding the periphery of the element by an element isolation insulating film, this element can be fully insulated from the periphery, and cross talk through the substrate can be effectively suppressed. However, the element is surrounded by a silicon oxide in this type of a semiconductor device, and since heat conductivity of a silicon oxide is much lower than the heat conductivity of silicon, radiation performance is extremely low. As a result, the temperature rises due to self heat generation of the element, and the driving current thereof is decreased. The heat conductivity of silicon (Si) is 1.56 W/cm·K, while the heat conductivity of silicon oxide ($SiO_2$) is 0.014 W/cm·K.

In order to improve radiation performance of the SOI substrate, use of an SON (silicon on nothing) substrate is one idea. The SON substrate is a silicon substrate in which a cavity is formed inside. By embedding an insulating material such as a silicon oxide or the like in the cavity of the SON substrate, an embedded insulating film can be locally formed in the silicon substrate. Then, by forming an element on this locally formed embedded insulating film, cross talk is suppressed to some degree, while radiation performance can be made higher than that of the SOI substrate. However, even in the SON substrate, since the embedded insulating film having low heat conductivity is present below the element, the radiation performance is not sufficient.

DETAILED DESCRIPTION

In general, according to one embodiment, a semiconductor device includes a semiconductor substrate, an insulating film, a heat conductive member, and an element. A cavity and a connecting hole are formed in the semiconductor substrate. The connecting hole spatially connects the cavity to an upper face of the semiconductor substrate. The insulating film is provided on inner faces of the cavity and the connecting hole. The heat conductive member is embedded in the cavity and the connecting hole. Heat conductivity of the heat conductive member is higher than heat conductivity of the insulating film. And, the element is formed in a region immediately above the cavity in the semiconductor substrate.

Embodiments of the invention will be described below by referring to the attached drawings.

First, a first embodiment will be described.

Figure 1A:
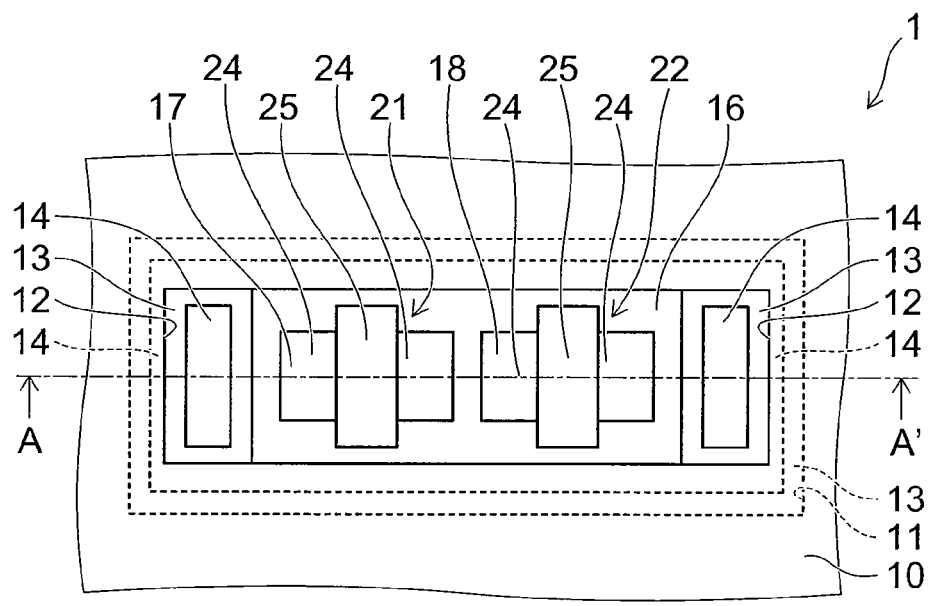
FIG. 1A is a plan view showing a semiconductor device according to a first embodiment.
Figure 1B:
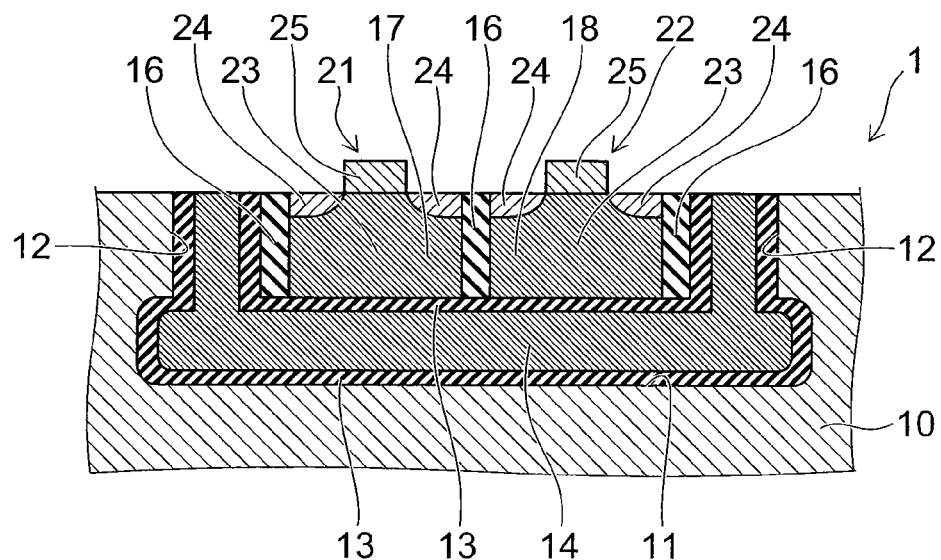
FIG. 1B is a cross-sectional view by an A-A' line illustrated in FIG. 1A.

FIG. 1A is a plan view showing a semiconductor device according to the embodiment, and FIG. 1B is a cross-sectional view by an A-A' line illustrated in FIG. 1A.

As illustrated in FIGS. 1A and 1B, a silicon substrate 10 is provided in a semiconductor device 1 according to the embodiment. The silicon substrate 10 is made of a single crystal of silicon, and the upper face thereof is a (100) face, for example. A cavity 11 is formed inside the silicon substrate 10. The shape of the cavity 11 is a substantial rectangular solid having the major surface in parallel with the upper face of the silicon substrate 10. Also, on two regions immediately above the both end portions in the longitudinal direction of the cavity 11 in the silicon substrate 10, two connecting holes 12 are formed. The lower ends of the connecting holes 12 are spatially connected to the cavity 11, while the upper ends are spatially connected to the upper face of the silicon substrate 10. As a result, the connecting holes 12 make the cavity 11 spatially connect to the upper face of the silicon substrate 10.

An insulating film 13 is provided on the inner faces of the cavity 11 and the connecting holes 12. The insulating film 13 is made of silicon oxide, for example. A heat conductive member 14 is embedded in the cavity 11 and the connecting holes 12. The heat conductivity of the heat conductive member 14 is higher than the heat conductivity of the insulating film 13. The heat conductive member 14 is made of an electrical conductive material, for example, silicon into which impurities are introduced or metal such as tungsten or the like. The heat conductive member 14 is insulated by the insulating film 13 from the silicon substrate 10.

In a region immediately above the cavity 11 in the silicon substrate 10 and in a region sandwiched by the two connecting holes 12, an element isolation insulating film 16 made of silicon oxide, for example, is provided. The upper face of the element isolation insulating film 16 is exposed on the upper face of the silicon substrate 10, and the lower face of the element isolation insulating film 16 is in contact with the insulating film 13. Also, when seen from the above, the shape of the element isolation insulating film 16 is the figure eight. As a result, the element isolation insulating film 16 separates the region into two regions 17 and 18. The element isolation insulating film 16 may extend from the region immediately above the cavity 11.

Two parts of the silicon substrate 10 are arranged in the regions 17 and 18, and elements 21 and 22 are formed, respectively. Therefore, the elements 21 and 22 are surrounded by the element isolation insulating film 16. In the example illustrated in FIGS. 1A and 1B, the elements 21 and 22 may be elements constituting an analog circuit, for example, or may be a MOSFET (metal oxide semiconductor field-effect transistor) constituting a CMOS (complementary metal oxide semiconductor). In the example illustrated in FIGS. 1A and 1B, a body region 23, source-drain regions 24, a gate insulating film (not shown) and a gate electrode 25 are provided respectively in the elements 21 and 22. The semiconductor device 1 is a semiconductor device which manages a high-frequency signal, for example, and is a device for communication application, for example.

Subsequently, a manufacturing method of the semiconductor device according to the embodiment will be described.

FIGS. 2A to 6B are process diagrams showing a manufacturing method of the semiconductor device according to the first embodiment, and FIGS. 2A, 3A, 4A, 5A, and 6A are plan views and FIGS. 2B, 3B, 4B, 5B and 6B are cross-sectional views by A-A' line illustrated in FIGS. 2A, 3A, 4A, 5A, and 6A.

Figure 2A:
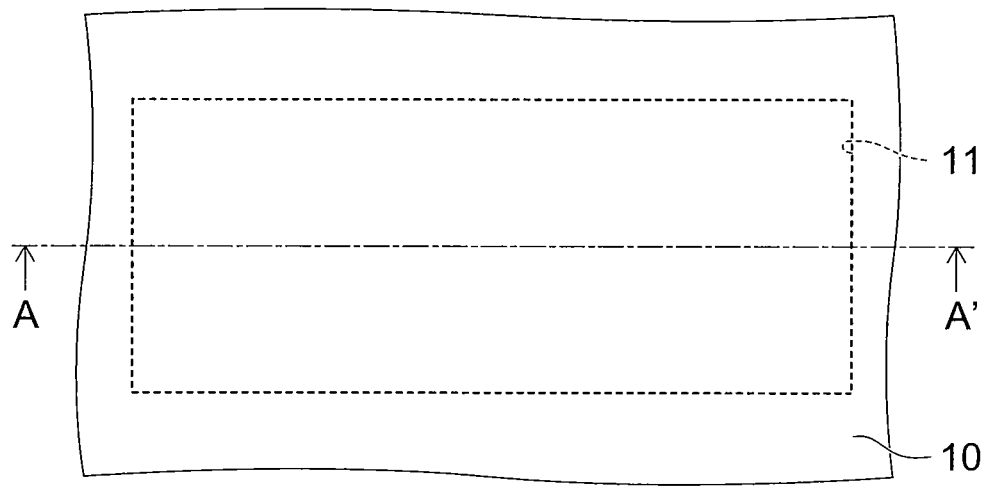
FIGS. 2A to 6B are process diagrams showing a manufacturing method of the semiconductor device according to the first embodiment.
Figure 2B:
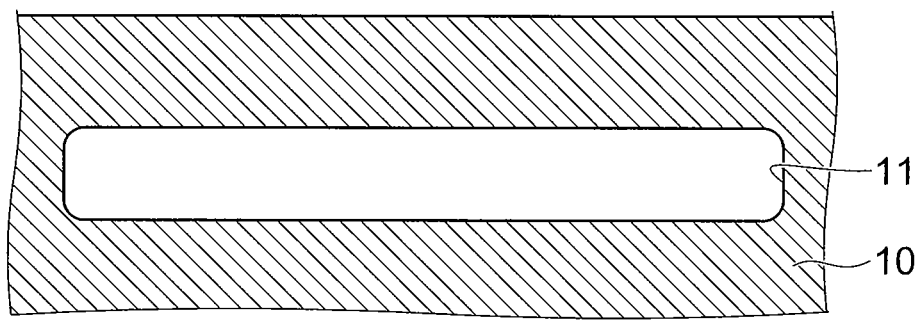

First, as illustrated in FIGS. 2A and 2B, a plurality of trenches (not shown) are formed in parallel with each other on the upper face of the silicon substrate 10. Subsequently, heat treatment is performed. This heat treatment is performed with a mixed atmosphere containing hydrogen and argon as an atmosphere, a pressure at 10 Torr (2666 Pa), a temperature at 1100° C., and time for 3 minutes, for example. As a result, an upper layer portion of the silicon substrate 10 is fluidized so as to form the cavity 11 inside the silicon substrate 10. The shape of the major surface of the cavity 11 is a substantial rectangular solid in parallel with the upper face of the silicon substrate 10.

Figure 3A:
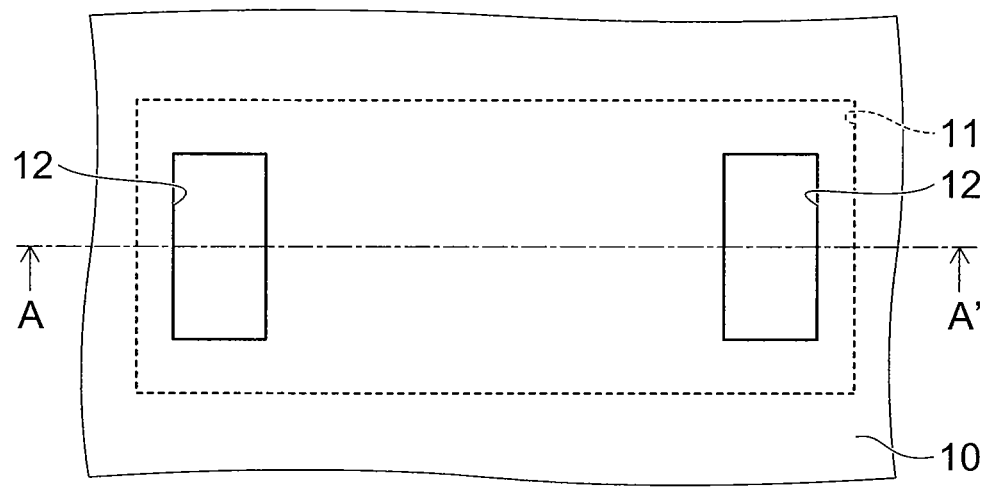
Figure 3B:
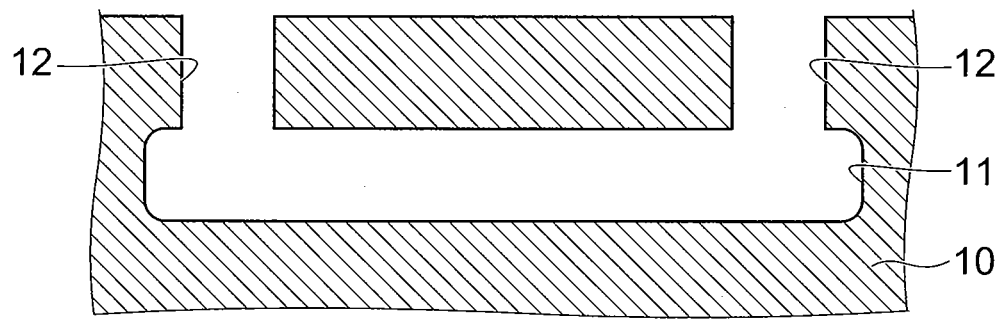

Subsequently, as illustrated in FIGS. 3A and 3B, the two connecting holes 12 are formed from the upper face of the silicon substrate 10 so as to reach the both end portions in the longitudinal direction of the cavity 11. As a result, the cavity 11 is made to connect with the upper face of the silicon substrate 10 spatially.

Figure 4A:
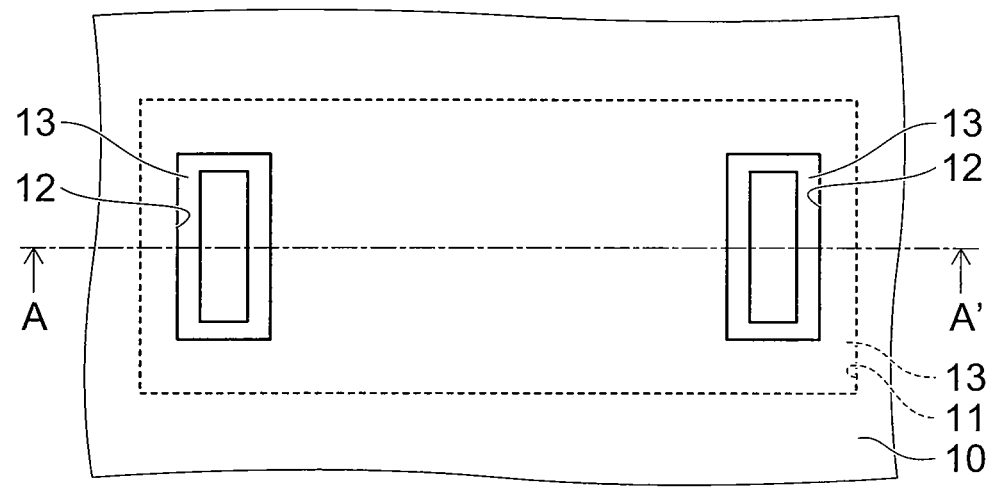
Figure 4B:
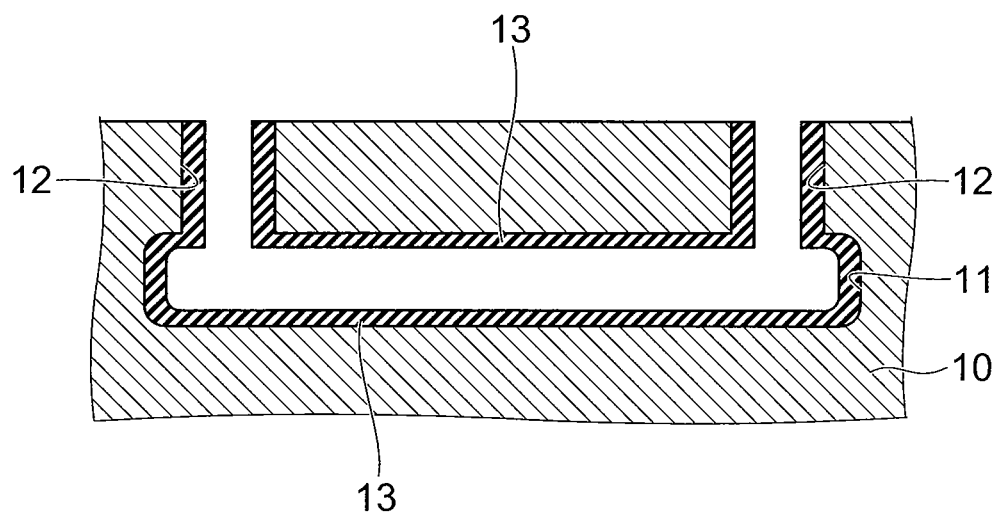

Subsequently, as illustrated in FIGS. 4A and 4B, heat oxidation treatment or LP-CVD (low pressure chemical vapor deposition) treatment is performed. As a result, on the inner faces of the cavity 11 and the connecting holes 12, the insulating film 13 made of silicon oxide is formed.

Figure 5A:
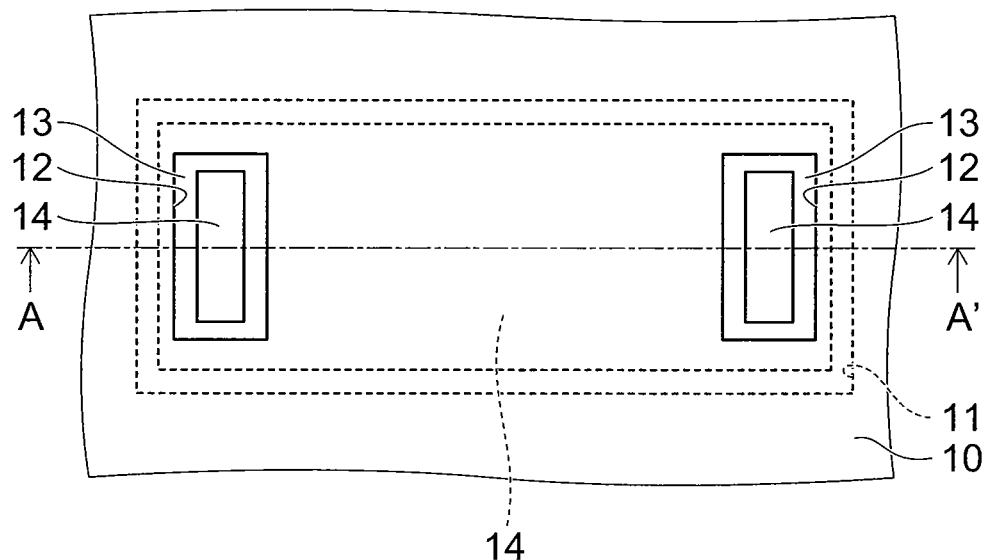
Figure 5B:
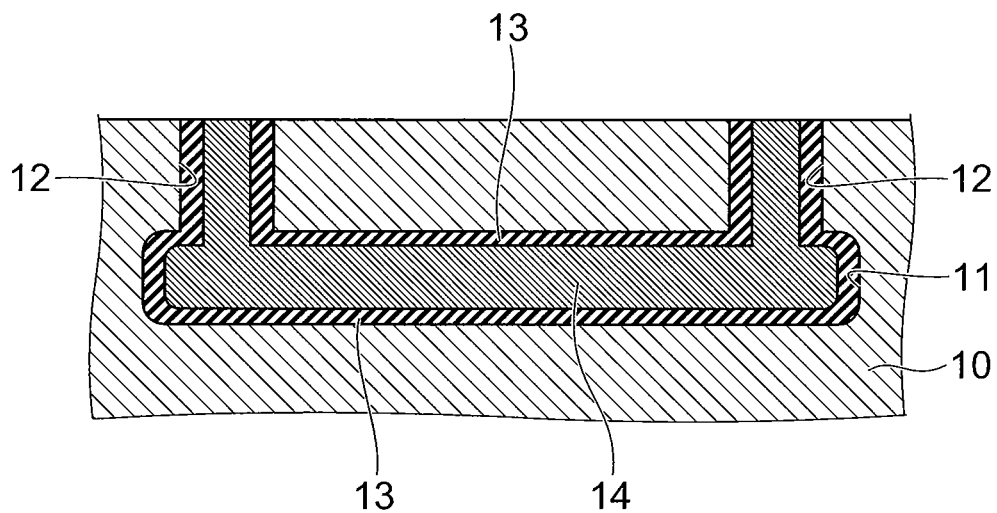

Subsequently, as illustrated in FIGS. 5A and 5B, a heat conductive material is made to deposit by the LP-CVD method, for example, so that a heat conductive member 14 is embedded inside the cavity 11 and the connecting holes 12. The heat conductive material which forms the heat conductive member 14 is a material having heat conductivity higher than the heat conductivity of the insulating film 13. The heat conductive material is an electrical conductive material, for example, and the material can be silicon into which impurities are introduced or metal such as tungsten or the like, for example.

Figure 6A:
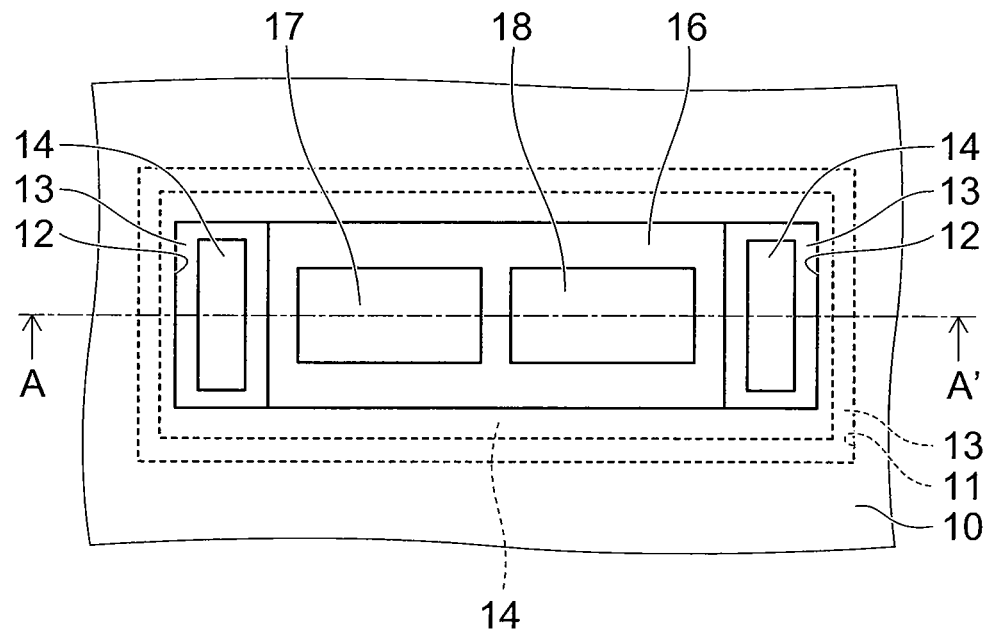
Figure 6B:
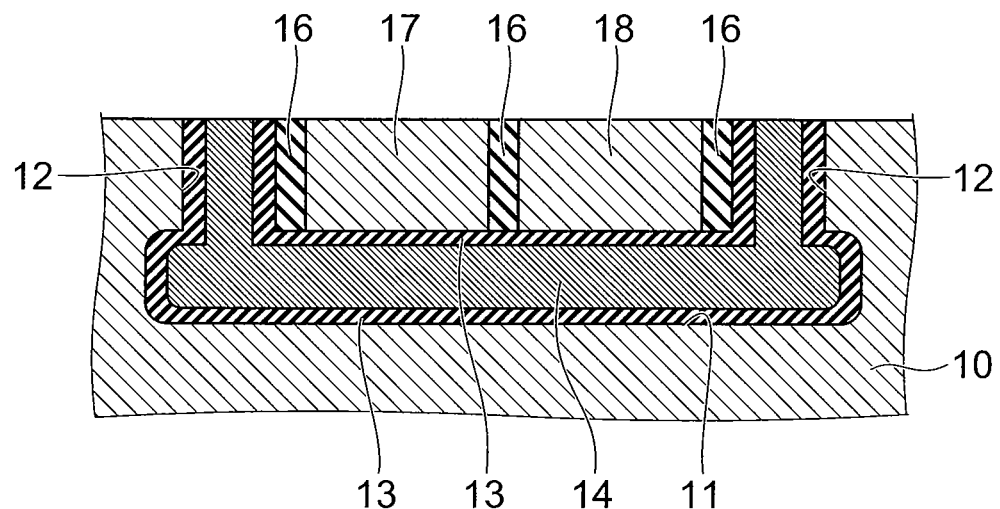

Subsequently, as illustrated in FIGS. 6A and 6B, the element isolation insulating film 16 is formed on a region immediately above the cavity 11 in the silicon substrate 10 and sandwiched by the two connecting holes 12. The element isolation insulating film 16 is formed so as to reach a portion formed on the cavity 11 in the insulating film 13 and to divide the region into one or more element formation regions. As a result, the two regions 17 and 18 are divided by the element isolation insulating film 16 from each other and also from the periphery.

Subsequently, as illustrated in FIGS. 1A and 1B, a body region 23, a gate insulating film (not shown), a gate electrode 25, and source-drain regions 24 are formed so that the elements 21 and 22 are formed in the regions 17 and 18, respectively. As a result, the semiconductor device 1 is manufactured.

Subsequently, effects of the embodiment will be described.

In the semiconductor device 1 according to the embodiment, the cavity 11 is formed in the silicon substrate 10, and the connecting holes 12 are formed so that the cavity 11 connects spatially with the upper face of the silicon substrate 10. On the inner faces of the cavity 11 and the connecting holes 12, the insulating film 13 is formed, and the heat conductive member 14 is embedded in the cavity 11 and the connecting holes 12. As a result, heat generated by operation of the elements 21 and 22 is transmitted to the heat conductive member 14 through the insulating film 13, and reaches the upper face of the silicon substrate 10 through the heat conductive member 14, and is discharged from the upper face of the silicon substrate 10. At this case, since the heat conductivity of the heat conductive member 14 is higher than the heat conductivity of the insulating film 13 and the heat conductive member 14 reaches to the upper face of the silicon substrate 10 through the connecting holes 12, the heat generated in the elements 21 and 22 can be effectively discharged. As a result, temperature rise of the elements 21 and 22 is suppressed. Since the heat conductive member 14 is insulated from the periphery by the insulating film 13, it does not affect the operations of the elements 21 and 22.

Also, since the insulating film 13 is provided on the region immediately below the elements 21 and 22, propagation of electric noise between the elements 21 as well as 22 and the other portions in the silicon substrate 10 can be prevented, and cross talk through the substrate can be suppressed. That is, inflow of the electric noise oscillated from the other elements formed on the silicon substrate 10 into the elements 21 and 22 can be suppressed, and also, inflow of the electric noise oscillated from the elements 21 and 22 to the other elements can be suppressed. Since the insulating film 13 is thinner than the embedded insulating film of the SOI substrate, heat discharging characteristics are not much disturbed.

Moreover, in the embodiment, since the element isolation insulating film 16 surrounding the elements 21 and 22 respectively is provided, above-described cross talk through the substrate can be suppressed more effectively. Particularly, by forming the element isolation insulating film 16 in contact with the insulating film 13, the elements 21 and 22 can be surrounded by the insulating film 13 and the element isolation insulating film 16 in a three-dimensional manner, and thus, cross talk through the substrate can be prevented more effectively.

Furthermore, in the embodiment, since the heat conductive member 14 is formed of an electrical conductive member, the heat conductive member 14 functions as a shield and can prevent propagation of electrical noise more reliably.

Subsequently, a second embodiment will be described.

Figure 7:
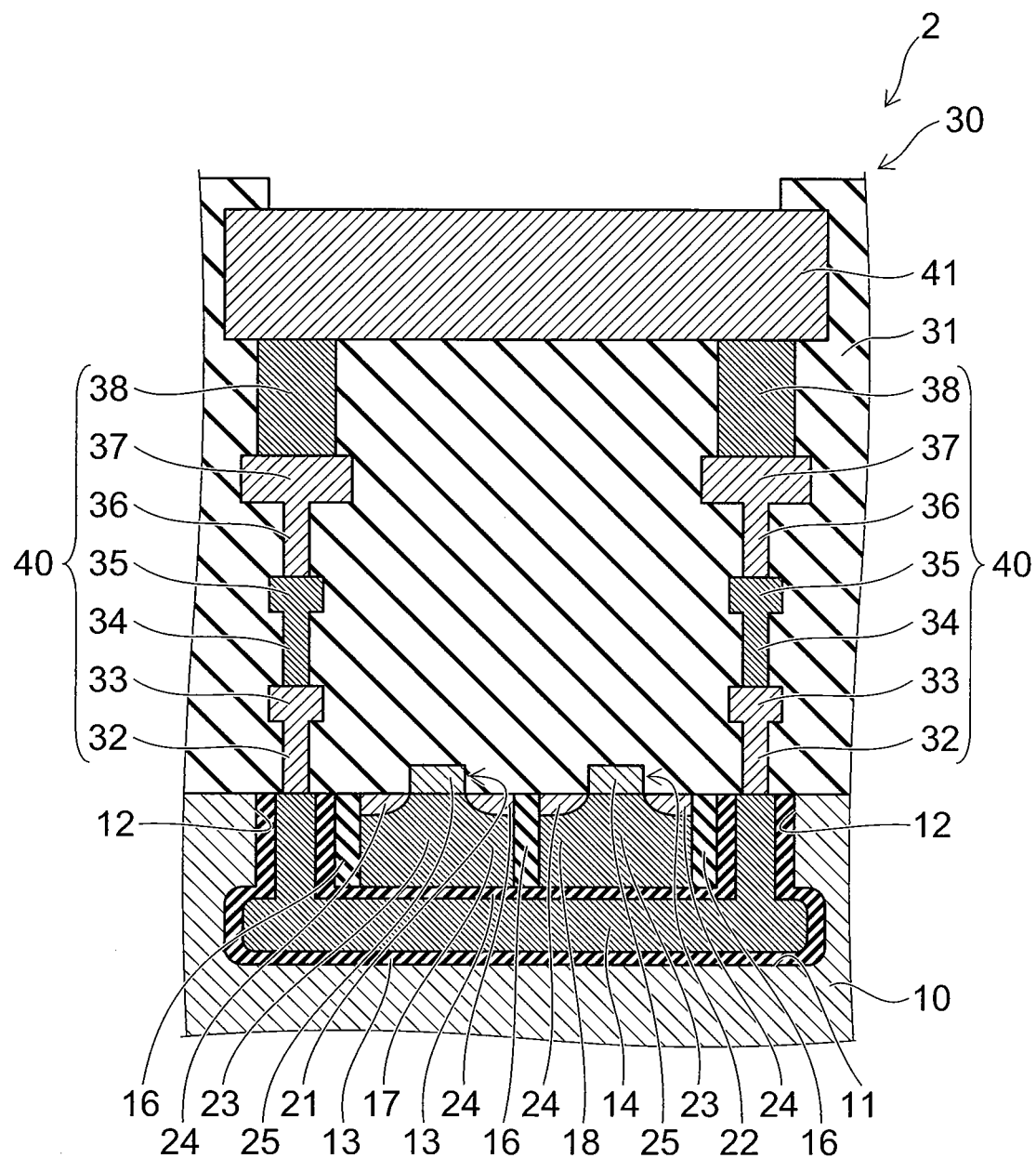
FIG. 7 is a cross-sectional view showing a semiconductor device according to a second embodiment.

FIG. 7 is a cross-sectional view showing a semiconductor device according to the embodiment.

As illustrated in FIG. 7, in a semiconductor device 2 according to the embodiment, in addition to the configuration of the semiconductor device 1 according to the above-described first embodiment, a multi-layer wiring layer 30 is provided. The multilayer wiring layer 30 is provided on the silicon substrate 10.

In the multilayer wiring layer 30, an interlayer insulating film 31 is provided. In the interlayer insulating film 31, a contact 32, a wire 33, a via 34, a wire 35, a via 36, a wire 37, and a via 38 are provided in this order from the lower part. These electrical conductive members, that is, the contact 32, the wire 33, the via 34, the wire 35, the via 36, the wire 37, and the via 38 are connected to each other and constitute an upper heat-conductive member 40. Each electrical conductive member constituting the upper heat-conductive member 40 is formed of metal such as tungsten, aluminum or the like, for example, and the interlayer insulating film 31 is formed of an insulating material such as silicon oxide or the like, for example. Thus, the heat conductivity of the upper heat-conductive member 40 is higher than the heat conductivity of the interlayer insulating film 31. Two upper heat-conductive members 40 are provided, and the lower end of each upper heat-conductive member 40, that is, the lower end of the contact 32 is connected to a portion exposed on the upper end of each connecting hole 12 of the heat conductive member 14.

Also, above the upper heat-conductive member 40 in the multilayer interconnect layer 30, an uppermost wire 41 is provided. The uppermost wire 41 is formed of metal and is electrically connected to the upper ends of the two upper heat-conductive members 40, that is, the upper ends of the vias 38. The uppermost wire 41 is a wire formed in an uppermost interconnect layer in the multilayer interconnect layer 30 and is a wire to which a reference potential such as a supply potential or a grounding potential or the like is applied, for example. A part of the upper face of the uppermost wire 41 is exposed on the upper face of the interlayer insulating film 31.

Subsequently, effects of the embodiment will be described.

In the semiconductor device 2 according to the embodiment, the heat having been transmitted by the heat conductive member 14 to the upper face of the silicon substrate 10 is transmitted to the uppermost wire 41 through the upper heat-conductive members 40. Then, the heat is discharged to the outside of the semiconductor device 2 through the uppermost wire 41. As described above, in the embodiment, by configuring a heat circuit by connecting from the heat conductive member 14 to the uppermost wire 41 by metal by using the multilayer wiring layer 30, the heat generated in the elements 21 and 22 can be discharged more efficiently.

Also, in the embodiment, since the upper heat-conductive member 40 and the uppermost wire 41 are formed of a conductive material, the elements 21 and 22 can be shielded by the heat conductive member 14, the upper heat-conductive member 40, and the uppermost wire 41 more effectively.

Moreover, in the embodiment, the reference potential applied to the uppermost wire 41 is applied to the heat conductive member 14 through the upper heat-conductive members 40. As a result, the potential of the heat conductive member 14 is fixed, an electromagnetic shielding effect by the heat conductive member 14 is further improved, and the propagation of the electric noise can be prevented more effectively. As a result, cross talk through the substrate can be suppressed more effectively.

The configuration, manufacturing method and effects other than the above in the embodiment are the same as those in the above-described first embodiment.

Subsequently, a third embodiment will be described.

Figure 8:
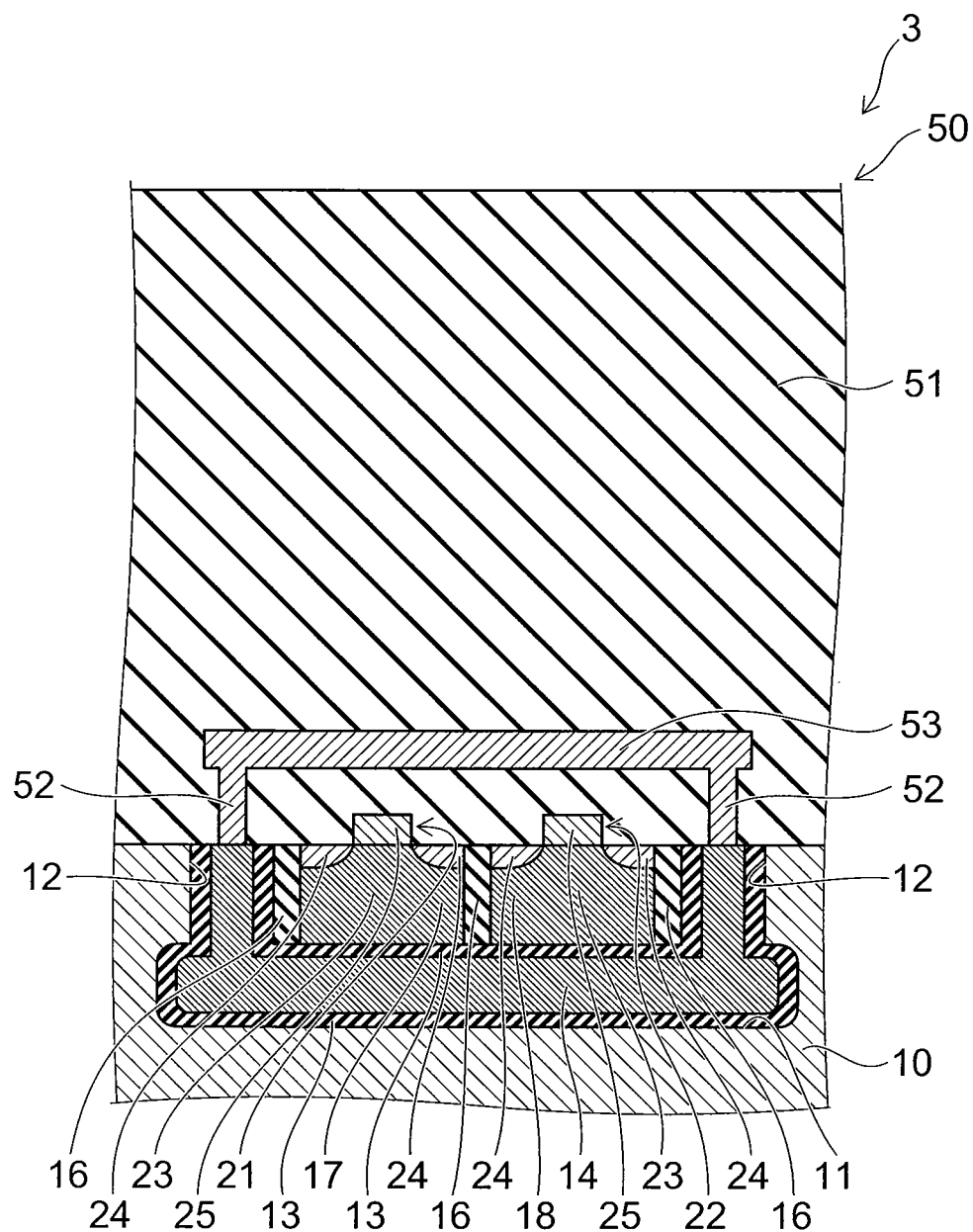
FIG. 8 is a cross-sectional view showing a semiconductor device according to a third embodiment.

FIG. 8 is a cross-sectional view showing a semiconductor device according to the embodiment.

As illustrated in FIG. 8, in a semiconductor device 3 according to the embodiment, in addition to the configuration of the semiconductor device 1 according to the above-described first embodiment, a multilayer interconnect layer 50 is provided. The multilayer interconnect layer 50 is provided on the silicon substrate 10.

In the multilayer interconnect layer 50, an interlayer insulating film 51 is provided. In the interlayer insulating film 51, contacts 52 as the upper heat-conductive members are provided. The contacts 52 are formed of metal such as tungsten, aluminum or the like, for example, and the interlayer insulating film 51 is formed of an insulating material such as silicon oxide or the like, for example. Thus, the heat conductivity of the contact 52 is higher than the heat conductivity of the interlayer insulating film 51. Two contacts 52 are provided, and the lower ends thereof are connected to a portion exposed on the upper ends of the connecting holes 12 of the heat conductive member 14.

Also, a wire member 53 is provided above the contacts 52 in the multilayer interconnect layer 50. The wire member 53 is formed of an electrical conductive material such as polysilicon into which impurities are introduced, metal or the like, for example. The wire member 53 is electrically connected to the upper ends of the two contacts 52, and thus, is connected to the heat conductive member 14 through the contacts 52. Also, the wire member 53 is arranged in a region containing the region immediately above the elements 21 and 22 and thus, when seen from above, the wire member 53 covers the elements 21 and 22. Moreover, the reference potential is applied to the wire member 53 through an uppermost wire (not shown).

Subsequently, effects of the embodiment will be described.

In the semiconductor device 3 in the embodiment, the wire member 53 is arranged in a portion immediately above the elements 21 and 22. As a result, the wire member 53, the contacts 52 and the heat conductive member 14 can substantially surround the elements 21 and 22 in a three-dimensional manner. As a result, a structural body made of the wire member 53, the contacts 52, and the heat conductive member 14 becomes a shield of the elements 21 and 22 and can protect the elements 21 and 22 not only from the electric noise through the silicon substrate 10 but also from the electric noise from above. Similarly, leakage of the electric noise generated from the elements 21 and 22 toward the upper part of the semiconductor device 2 can be prevented effectively.

Also, in the embodiment, the reference potential applied to the wire member 53 is applied to the heat conductive member 14 through the contacts 52. As a result, the potential of the shield surrounding the elements 21 and 22 is fixed, and the electromagnetic shielding effect can be further improved. As a result, cross talk through the substrate can be suppressed more effectively.

Moreover, since the heat transmitted up to the upper face of the silicon substrate 10 by the heat conductive member 14 is transmitted to the upper part of the multilayer interconnect layer 50 through the contacts 52 and the wire member 53, the heat generated in the elements 21 and 22 can be discharged more efficiently.

The configuration, manufacturing method, and effects other than above in the embodiment are the same as those in the above-described first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

For example, in each of the above-described embodiments, the example in which the heat conductive member 14 is formed of an electrical conductive material is shown, but the present invention is not limited by that, and it is only necessary that the heat conductive member 14 is formed of a material having the heat conductivity higher than the heat conductivity of the insulating film 13. For example, the heat conductive member 14 can be formed of silicon into which impurities are not introduced. In this case, too, similarly to each of the above-described embodiments, the effect that the heat generated in the elements 21 and 22 is discharged can be obtained. Also, in this case, since the heat conductive member 14 electrically functions as a thick insulating film, cross talk through the substrate can also be suppressed.

Also, the number of the connecting holes 12 is not limited two and the number may be one or three or more. Also, the formation positions of the connecting holes 12 are not limited to the region immediately above the both end portions in the longitudinal direction of the cavity 11. However, it is necessary to leave a silicon portion to an extent that the portion arranged on the region immediately above the cavity 11 in the silicon substrate 10 can be supported in the process illustrated in FIGS. 3 and 4.

Moreover, in each of the above-described embodiments, the example in which the upper heat-conductive member extends in the vertical direction is shown, but the present invention is not limited by that, for example, the upper heat-conductive member may extend in the horizontal direction as well as in the vertical direction.

According to the embodiments having been described, the semiconductor device which can suppress cross talk through the substrate and has high radiation performances can be realized.

What is claimed is:

1. A semiconductor device, comprising:
    a semiconductor substrate having a cavity and a connecting hole formed therein, the connecting hole spatially connecting the cavity to an upper face of the semiconductor substrate;
    an insulating film provided on inner faces of the cavity and the connecting hole;
    a heat conductive member embedded in the cavity and the connecting hole, heat conductivity of the heat conductive member being higher than heat conductivity of the insulating film; and
    an element formed in a region immediately above the cavity in the semiconductor substrate.

2. The semiconductor device according to claim 1, further comprising:
    an interlayer insulating film provided on the semiconductor substrate; and
    an upper heat-conductive member provided in the interlayer insulating film and electrically connected to the heat conductive member, heat conductivity of the upper heat-conductive member being higher than the heat conductivity of the interlayer insulating film.

3. The semiconductor device according to claim 2, further comprising
    a wire member provided in the interlayer insulating film, formed of an electrical conductive material, and electrically connected to the heat conductive member, wherein the heat conductive member and the upper heat-conductive member are formed of an electrical conductive material.

4. The semiconductor device according to claim 3, wherein a part of an uppermost layer of the wire member is exposed from the interlayer insulating film.

5. The semiconductor device according to claim 3, wherein a reference potential is applied to the wire member.

6. The semiconductor device according to claim 3, wherein the wire member is disposed in a region including the region immediately above the element.

7. The semiconductor device according to claim 1, wherein the heat conductive member is formed of an electrical conductive material.

8. The semiconductor device according to claim 7, wherein the electrical conductive material is silicon having impurities.

9. The semiconductor device according to claim 7, wherein the electrical conductive material is metal.

10. The semiconductor device according to claim 1, further comprising:
    an element isolation insulating film provided in the region immediately above the cavity and surrounding the element.

* * * * *